(12) United States Patent
Morse

(10) Patent No.: US 11,603,589 B2
(45) Date of Patent: Mar. 14, 2023

(54) SYSTEMS AND METHODS FOR ADDITIVE MANUFACTURING FOR THE DEPOSITION OF METAL AND CERAMIC MATERIALS

(71) Applicant: Arizona Thin Film Research, LLC, Tucson, AZ (US)

(72) Inventor: Patrick Morse, Tucson, AZ (US)

(73) Assignee: Arizona Thin Film Research, LLC, Tucson, AZ (US)

( * ) Notice: Subject to any disclaimer, the term of this patent is extended or adjusted under 35 U.S.C. 154(b) by 319 days.

(21) Appl. No.: 16/769,661

(22) PCT Filed: Dec. 5, 2018

(86) PCT No.: PCT/IB2018/059678
§ 371 (c)(1),
(2) Date: Jun. 4, 2020

(87) PCT Pub. No.: WO2019/111183
PCT Pub. Date: Jun. 13, 2019

(65) Prior Publication Data
US 2021/0180179 A1  Jun. 17, 2021

Related U.S. Application Data

(60) Provisional application No. 62/595,247, filed on Dec. 6, 2017.

(51) Int. Cl.
*C23C 14/04* (2006.01)
*C23C 14/32* (2006.01)
(Continued)

(52) U.S. Cl.
CPC .............. *C23C 14/32* (2013.01); *B33Y 30/00* (2014.12); *C23C 14/04* (2013.01); *C23C 14/14* (2013.01); *B33Y 50/02* (2014.12); *C23C 14/54* (2013.01)

(58) Field of Classification Search
CPC ......... C23C 14/14; C23C 14/32; B33Y 30/00; H01J 37/3178
See application file for complete search history.

(56) References Cited

U.S. PATENT DOCUMENTS 4,152,478 A  5/1979  Takagi
4,382,975 A  5/1983  Jones
(Continued)

FOREIGN PATENT DOCUMENTS

AU       655009 B2     12/1994
CN     104962863 A     10/2015
(Continued)

OTHER PUBLICATIONS

EPO Extended Search Report for App. No. 18885163.8 dated Jul. 7, 2021.
(Continued)

*Primary Examiner* — Joseph A Miller, Jr.
(74) *Attorney, Agent, or Firm* — Law Offices of Damon L. Boyd, PLLC

(57) ABSTRACT

The present disclosure relates to systems and methods of additive manufacturing that reduce or eliminates defects in the bulk deposition material microstructure resulting from the additive manufacturing process. An additive manufacturing system comprises evaporating a deposition material to form an evaporated deposition material and ionizing the evaporated deposition material to form an ionized deposition material flux. After forming the ionized deposition material flux, the ionized deposition material flux is directed through an aperture, accelerated to a controlled kinetic energy level and deposited onto a surface of a substrate. The aperture mechanism may comprise a physical, electrical, or magnetic aperture mechanism. Evaporation of the deposition material may be performed with an evaporation mechanism com- (Continued)

prised of resistive heating, inductive heating, thermal radiation, electron heating, and electrical arc source heating.

6 Claims, 5 Drawing Sheets

(51) Int. Cl.
  *B33Y 30/00* (2015.01)
  *C23C 14/14* (2006.01)
  *B33Y 50/02* (2015.01)
  *C23C 14/54* (2006.01)

(56) References Cited

U.S. PATENT DOCUMENTS

| | | | |
|---|---|---|---|
| 4,390,571 A | 6/1983 | Cosgrove et al. | |
| 4,687,939 A | 8/1987 | Miyauchi et al. | |
| 5,266,117 A | 11/1993 | Beisswenger et al. | |
| 5,321,792 A | 6/1994 | Schonnherr et al. | |
| 8,025,749 B2 | 9/2011 | Perry et al. | |
| 2003/0052000 A1 | 3/2003 | Segal et al. | |
| 2003/0094366 A1 | 5/2003 | Inaba et al. | |
| 2005/0000444 A1* | 1/2005 | Hass | C23C 14/30 427/255.28 |
| 2014/0017393 A1* | 1/2014 | Schmidt | H01H 11/041 427/552 |

FOREIGN PATENT DOCUMENTS

| | | |
|---|---|---|
| DE | 2020015100465 U1 | 2/2015 |
| EP | 0047456 B1 | 7/1984 |
| JP | 200212730 A | 8/2000 |
| WO | WO2011140481 A1 | 11/2011 |

OTHER PUBLICATIONS

Feb. 28, 2022 Reply to Extended Search Report for App. No. 18885163.8 dated Jul. 7, 2021.
Chinese Examination Report and translation summary for App. No. 201880088787.8 dated Mar. 8, 2022.
Talivaldis Spalvins and William A. Brainard, "Ion Plating With an Induction Heating Source," NASA Technical Memorandum, NASA TM X-3330, Jan. 1976, pp. 1-7, published in the United States of America by the National Aeronautics and Space Administration, Washington, D C. 20546.
International Search Report for PCT/IB2018/059678 dated Apr. 30, 2019.
Written Opinion for PCT/IB2018/059678 dated Apr. 30, 2019.
Author Unknown, "Practical Information on Selecting a Target Material to Coat SEM Samples," publication date unknown, published at https://www.nanoandmore.com/pdf_downloads/accessories/Practical%20Information%20on%20Selecting%20a%20Target%20Material%20to%20Coat%20SEM%20Samples.pdf.

\* cited by examiner

SYSTEMS AND METHODS FOR ADDITIVE MANUFACTURING FOR THE DEPOSITION OF METAL AND CERAMIC MATERIALS

CROSS REFERENCE TO RELATED APPLICATIONS

This patent application is a national stage entry application claiming priority under 35 U.S.C. § 371(c) to PCT/IB2018/059678, entitled "SYSTEMS AND METHODS FOR ADDITIVE MANUFACTURING FOR THE DEPOSITION OF METAL AND CERAMIC MATERIALS," filed Dec. 5, 2018, which is related to and claims priority under 35 U.S.C. § 119(e) to U.S. Provisional Patent Application No. 62/595,247, entitled "SYSTEMS AND METHODS FOR ADDITIVE MANUFACTURING FOR THE DEPOSITION OF METAL AND CERAMIC MATERIALS," filed Dec. 6, 2017.

BACKGROUND

Field

The present disclosure relates generally to systems and methods for additive manufacturing.

Background

Conventional additive manufacturing typically involves changing the state of a deposition material from a liquid or powder to a solid on the surface of a substrate. Conventional processes by which solid deposition materials are formed on the surface of a substrate can incorporate defects such as contaminants and or imperfections in the bulk deposition material in the form of binders, trapped gas, particulates, dislocations, and voids. Defects in deposition materials can affect the bulk deposition material properties such as the density, micro structure, thermal conductivity, electrical conductivity, yield strength, secondary electron yield, sputter yield, optical properties, and various other deposition material properties. Accordingly, there is a need for to eliminate defects and control the bulk deposition material microstructure.

SUMMARY

In general, the present disclosure provides systems and methods of additive manufacturing that reduce or eliminate defects in the bulk deposition material microstructure resulting from the additive manufacturing process. In accordance with the present disclosure, an additive manufacturing system comprises evaporating a deposition material to form an evaporated deposition material and then ionizing the evaporated deposition material to form an ionized deposition material flux. After forming the ionized deposition material flux, the ionized deposition material flux is directed through an aperture, accelerated to a controlled kinetic energy level and deposited onto a surface of a substrate. The aperture mechanism may comprise a physical, electrical, or magnetic aperture mechanism.

In accordance with various aspects of the present disclosure, evaporation of the deposition material may be performed with an evaporation mechanism comprised of any known or as yet unknown heating source such as resistive heating, inductive heating, thermal radiation, electron heating, plasma heating, and electrical arc source heating.

In accordance with various aspects of the present disclosure, the surface of the substrate can be any combination of positive, negative, and grounded electrical potentials to control the kinetic energy of the ionized deposition material flux arriving at the surface of the substrate.

In accordance with various aspects of the present disclosure, the substrate electrical potential is at least one of constant, variable with time, or synchronized with one or more electrical of deposition material flux variations in the mechanism.

BRIEF DESCRIPTION OF THE DRAWINGS

The accompanying drawings are included to provide a further understanding of the disclosure and are incorporated in and constitute a part of this specification, illustrate embodiments of the disclosure, and together with the description serve to explain the principles of the disclosure, wherein.

DETAILED DESCRIPTION OF THE ILLUSTRATED EMBODIMENTS

Figure 1:
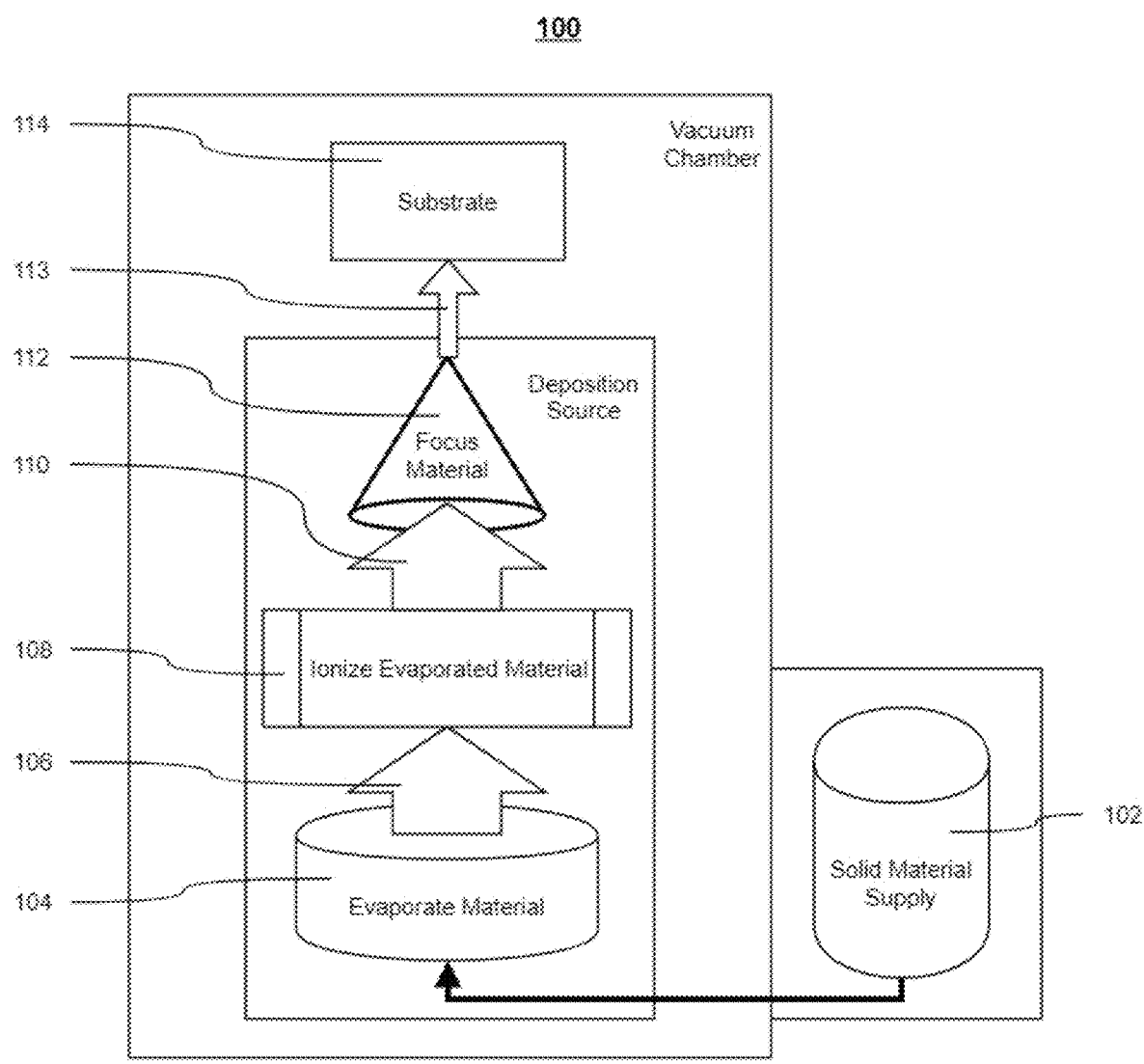
FIG. 1 is a diagram of an additive manufacturing process in accordance with the present disclosure with a single deposition material feed source, an evaporation means, an ionization means, a deposition material flux focusing means, and a substrate located inside a vacuum chamber.

Persons skilled in the art will readily appreciate that various aspects of the present disclosure can be realized by any number of methods and systems configured to perform the intended functions. Stated differently, other methods and systems can be incorporated herein to perform the intended functions. It should also be noted that the accompanying drawing figures referred to herein are not all drawn to scale, but may be exaggerated to illustrate various aspects of the present disclosure, and in that regard, the drawing figures should not be construed as limiting. Finally, although the present disclosure can be described in connection with various principles and beliefs, the present disclosure should not be bound by theory.

In general, the present disclosure provides systems and methods of additive manufacturing that reduce or eliminates defects in the bulk deposition material microstructure resulting from the additive manufacturing process. In this regard, various apparatus and methods to provide metal and/or ceramic deposition material vapor based additive manufacturing using a focused ion plating process are disclosed and described herein. Normally reserved for thin films deposition, in accordance with the present disclosure, ion plating is utilized in a point source configuration to focus the deposition to a small area on the substrate surface for an additive manufacturing process. Examples of structures and approaches for designing and using components contemplated by the present disclosure can be found in Anatoly Kuzmichev and Leonid Tsybulsky (2011). "Evaporators with Induction Heating and Their Applications, Advances in Induction and Microwave Heating of Mineral and Organic Materials," Prof. StanisÅ‚aw Grundas (Ed.), ISBN: 978-953-307-522-8, InTech, which is hereby incorporated by reference.

For example, with an additive process in accordance with the present disclosure, a deposition material may be added to the surface of a substrate by evaporating the deposition material with an evaporating mechanism within a vacuum chamber and ionizing the deposition material once in the vapor state. Examples of deposition materials that may be deposited in the context of the present disclosure include metal and or ceramic such as aluminum, copper, titanium, silicon, lithium, silver, gold, iron, stainless steel, silicon dioxide, silicon nitride, alumina, and any other metals, metal alloys, metal oxide, or ceramic that can be evaporated, ionized, and condensed on the substrate surface, though the scope of the present disclosure is not limited to such deposition materials, and other deposition materials now known or as yet unknown may be used and fall within the scope of the present disclosure. Likewise, examples of substrates that may receive the deposited deposition material in the context of the present disclosure include any solid and electrically conductive metals, metal alloys, or partially conductive ceramic materials such as stainless steel, aluminum, copper, iron, titanium, and molybdenum. Insulating materials can also be used if the substrate bias voltage is created on the surface of the material with high frequency capacitive coupling or by accelerating the ions prior to the arrival at the substrate surface with a grid or alternative acceleration means. Notwithstanding the forgoing, though the scope of the present disclosure is not limited to such substrates, and other substrates now known or as yet unknown may be used and fall within the scope of the present disclosure. End products that benefit from being manufactured using the processes within the scope of the present disclosure include but are not limited to, target materials for sputtering processes, turbine blades, flexible or rigid electronic circuits or packages, and the manufacturing of fully functional high-density metal prototypes with controlled grain sizes, grain structures, and material purity.

A process in accordance with the present disclosure may use a vacuum chamber containing an evaporator to vaporize a deposition material, a flux control aperture to limit the evaporation source view-factor to the substrate surface, a plasma source to ionize the evaporated flux, and a biased substrate.

In accordance with the present disclosure, the ionized deposition material then travels through a flux control aperture between the evaporation source and the substrate, after which the ionized vapor is then accelerated onto the surface of an electrically biased substrate. By regulating and controlling the bias on the substrate, the kinetic energy of the ionized vapor, and the substrate temperature can be used, alone or together, to control the deposited deposition material microstructure and or other deposition material properties.

In accordance with the present disclosure, various heat source mechanisms, now known or as yet unknown, can be used to evaporate the deposition material. For example, resistive heating is commonly used for evaporation processes for deposition materials such as aluminum. Resistive heating requires the deposition material to contact an evaporation boat for heat transfer. However, the deposition material the evaporation boats are comprised of can become a possible contaminant in the evaporation process. Non-contact evaporation heat source means such as inductive heating or electron beam evaporation eliminate evaporation boat contaminants but still require the deposition material to be in direct contact with a crucible. Inductive heating sources have been successfully used to evaporate the deposition material and ionize the vapor flux making it a desired heating mechanism.

In accordance with other aspects of the present disclosure, deposition flux producing source mechanisms such as cathodic arc and sputtering sources can be utilized, but may require increased process pressures to operate which can contaminate the deposited deposition material. Moreover, such sources may produce a lower amount of the deposition flux rate of evaporation.

In accordance with the present disclosure, various means of supplying and containing the deposition material into the evaporation source can be used and the deposition material properties and availability may dictate how the deposition material is fed into the evaporation source. For example, for more ductile metals it is possible to use one or more wire feeds to supply deposition material, while ceramic deposition materials are likely to be fed in a powder or pellet form. Additionally, multiple deposition materials can be fed into a single evaporation crucible assuming the heat source can melt and evaporate them concurrently.

In accordance with the present disclosure, various ionization source mechanisms can also be utilized to ionize the vapor flux. For example, inductively coupled plasma sources running in a kilohertz to megahertz range are commonly used in conventional ion plating processes and can be utilized on either side of a deposition flux aperture as disclosed herein. Alternatively, magnetron or cathodic arc sources can also be utilized on either side of the deposition flux aperture to ionize the vapor flux.

In accordance with the present disclosure, the physical deposition flux control aperture mechanism is configured to limit a view factor between the evaporation source and the substrate to produce a controlled stream of ionized vapor that contact the substrate with a surface area defined by view factor. As used herein, "view factor" means the cross-sectional area of the ionized deposition flux arriving on the surface of the substrate compared to the cross-sectional area of the deposition flux coming out of the evaporation source.

The physical aperture can take any suitable form. For example, the aperture can be composed of a high temperature refractory metal that is heated to temperatures slightly above or below the melting temperature of the ionized evaporation flux to reduce the sticking coefficient or to allow deposited material to re-evaporate. The aperture can be composed of electrically conductive metals that are charged to a potential that deflects the ions away from the surface of the aperture in a manner that either funnels the ion flux through the aperture or only allows ions traveling in a portion of the aperture cross-section to travel through the aperture. Additionally, the aperture can be composed of a physical structure that produces magnetic fields that guide the ionized deposition flux through the aperture. The magnetic fields strength in and around the aperture can be controlled if the fields are produced by conductive coils. Electro-magnets or super conducting magnets can be used as they have magnetic field strengths capable of accurately controlling the funneling and direction of ionized species on the order of 1 to 10 tesla.

Those skilled in the art appreciate that evaporation is a "line of sight" process and thus, shadowing produced by the crucible or the deposition flux control will reduce the deposition rate and build up condensed deposition material on surfaces. In accordance with the present disclosure, various methods can be used to reduce or eliminate the condensed deposition material on these surfaces.

One method is to modify the sticking coefficient of the surfaces by controlling the temperature. For example, increasing the temperature of the surfaces decreases the probability that the vapor will condense on the surfaces. Utilizing deposition materials that are transparent to inductive heating surfaces allows condensed deposition material to be evaporated once it reaches a thickness required for inductive heating. Additionally, if the evaporation flux is ionized prior to encountering the control surfaces, an electrical bias and/or magnetic field can be utilized to focus and steer the ion flux to the substrate while keeping the ion flux away from the flux control aperture.

In accordance with various aspects of the present disclosure, the aperture mechanism can be produced with electric fields. For example, ionized sputter flux can be positively charged and will be repelled from positively charged electrodes. Directing the ions away from the ionization means and through focusing and steering electrodes set up as an electric field aperture mechanism can allow the flux to be focused into a tight beam that can be steered onto the surface of the substrate. Being able to electrically control the ionized deposition flux position on the surface of the substrate without the use of moving parts can eliminate some of the axis of movement required for the relative motion between the substrate and the deposition source.

Relative movement between the ionized flux coming out of the aperture and the substrate surface may be used for functional additive manufacturing processes as contemplated by the present disclosure. The relative movement can be utilized to optimize the thermal management of the substrate and the condensate growth to minimize internal stresses created between materials with different coefficients of thermal expansion. The ionized flux contact point on the substrate may move relative to the substrate, the substrate may move relative to the ionized flux contact point on the substrate, or a combination of moving both the ionized flux contact point and moving the substrate may be used.

For example, in accordance with an embodiment contemplated by the present disclosure, when making target materials for rotary cathode sputtering processes, the substrate may be a backing tube that rotates to apply the target material all the way around the tube's outer diameter. To deposit along the axis or rotation of the tube, the ionized flux contact point moves relative to the axis of rotation or the target tube moves relative to the ionized flux contact point along the target tube axis or rotation.

In accordance with various aspects of the present disclosure, more than one species of deposition flux can be deposited on the surface of a substrate to produce alloys or custom compounds. In this regard, deposition material mixing can take place in several different locations within the disclosed processes and systems. For example, multiple deposition materials can be co-evaporated in a single crucible, vapor flux can be combined outside of independent crucibles in an ionization process, vapor flux can be combined before or after the aperture, and/or separate ionized vapor streams can be combined at the substrate surface.

Additionally, ionized vapor streams can be reacted with process gasses to produce reactive compounds on the surface of the substrate. For example, oxide, nitride, carbides, and other compounds can be formed using the addition of process gasses. Reacting a process gas with the ionized deposition flux may take place at or near the surface of the substrate. The pressure in the deposition source should be low enough to maximize the mean free path and reduce scattering of the vapor. Inside the source, the base pressure should be below 1 e-5 Torr and the operating pressure should be below 1 e-4 Torr. Outside of the source and the aperture the pressure can be increased to facilitate a reaction between the flux and the process gas on or near the substrate.

Systems and methods in accordance with the present disclosure provide various advantages and benefits. For example, no external gas supplies are required to operate the deposition process and thus, the deposited deposition material will not be contaminated with deposition gasses. The same may allow higher density deposition of high purity deposition materials. Additionally, ionization and controlling the kinetic energy of the vapor flux arriving at the surface of the substrate allows for deposition material property tuning not generally present in conventional additive manufacturing processes.

The above aspects of the present disclosure being described, referring now to FIG. 1, an exemplary embodiment in accordance with the present disclosure of an additive manufacturing process 100 with a solid deposition material supply 102 that supplies an evaporator 104 is illustrated. The evaporator 104 produces an evaporation flux 106 directed into an ionization device 108 that ionizes at least a portion of the evaporation flux 106. Ionized evaporation flux 110 then travels through an aperture 112 that reduces the cross section of the ionized evaporation flux 106 traveling toward a substrate 114 to a final ionized evaporation flux cross section 113 that matches deposition spot size required by the additive manufacturing process requirements.

Figure 2:
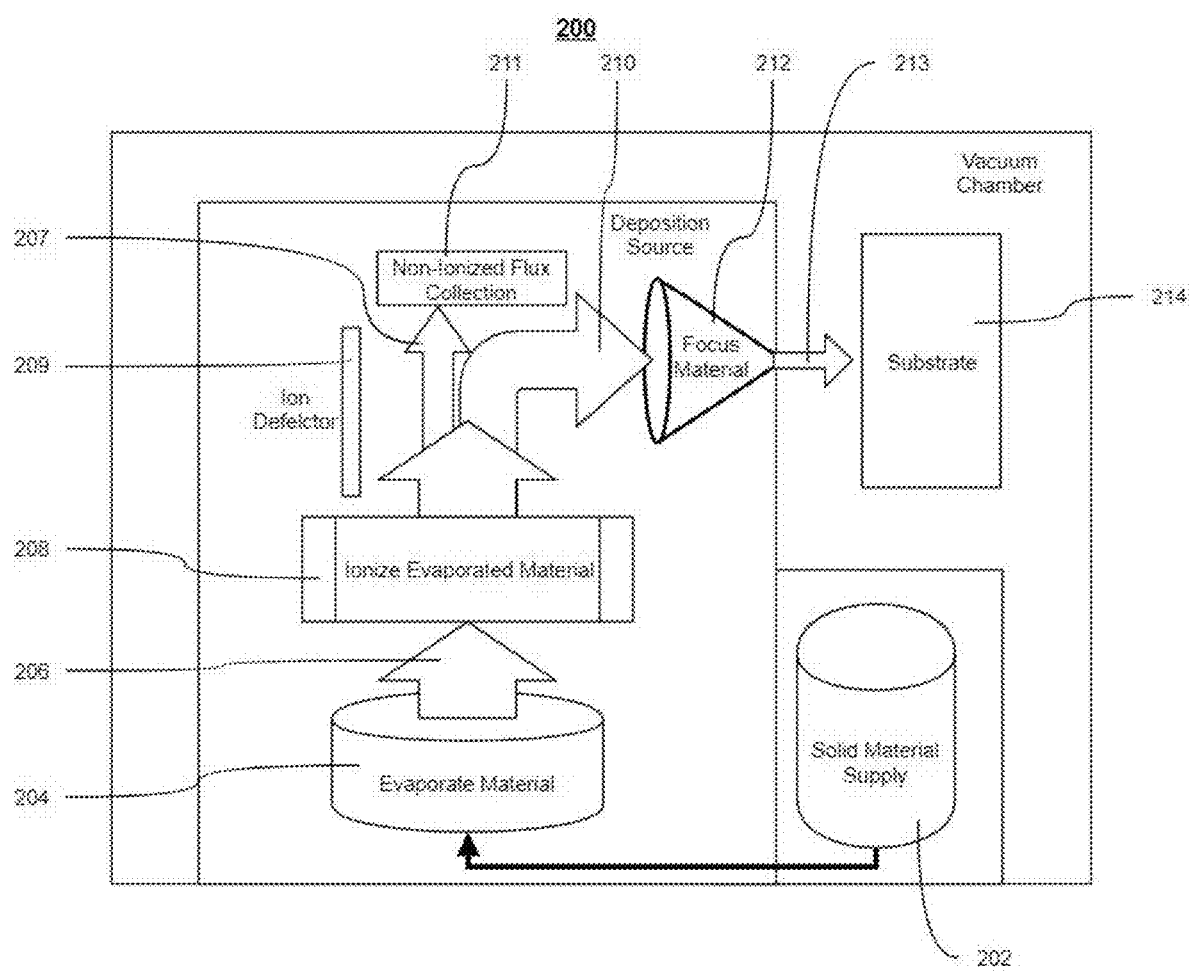
FIG. 2 is a diagram of an additive manufacturing process in accordance with the present disclosure that separates an ionized evaporation flux from non-ionized evaporation flux using an ion deflector.

FIG. 2 illustrates another exemplary embodiment in accordance with the present disclosure of an additive manufacturing process 200 that filters out ionized evaporation flux 206 from the non-ionized evaporation flux 207 coming out of the ionization device 208 using an ion deflector 209. The ion deflector 209 turns the ionization flux 206 toward the aperture 212 and allows the non-ionized evaporation flux 207 to collect onto a condensate collection shield 211. By turning the ionization flux 206 any contamination of the substrate 214 or the aperture 212 with non-ionized evaporation flux is minimized or eliminated.

Figure 3:
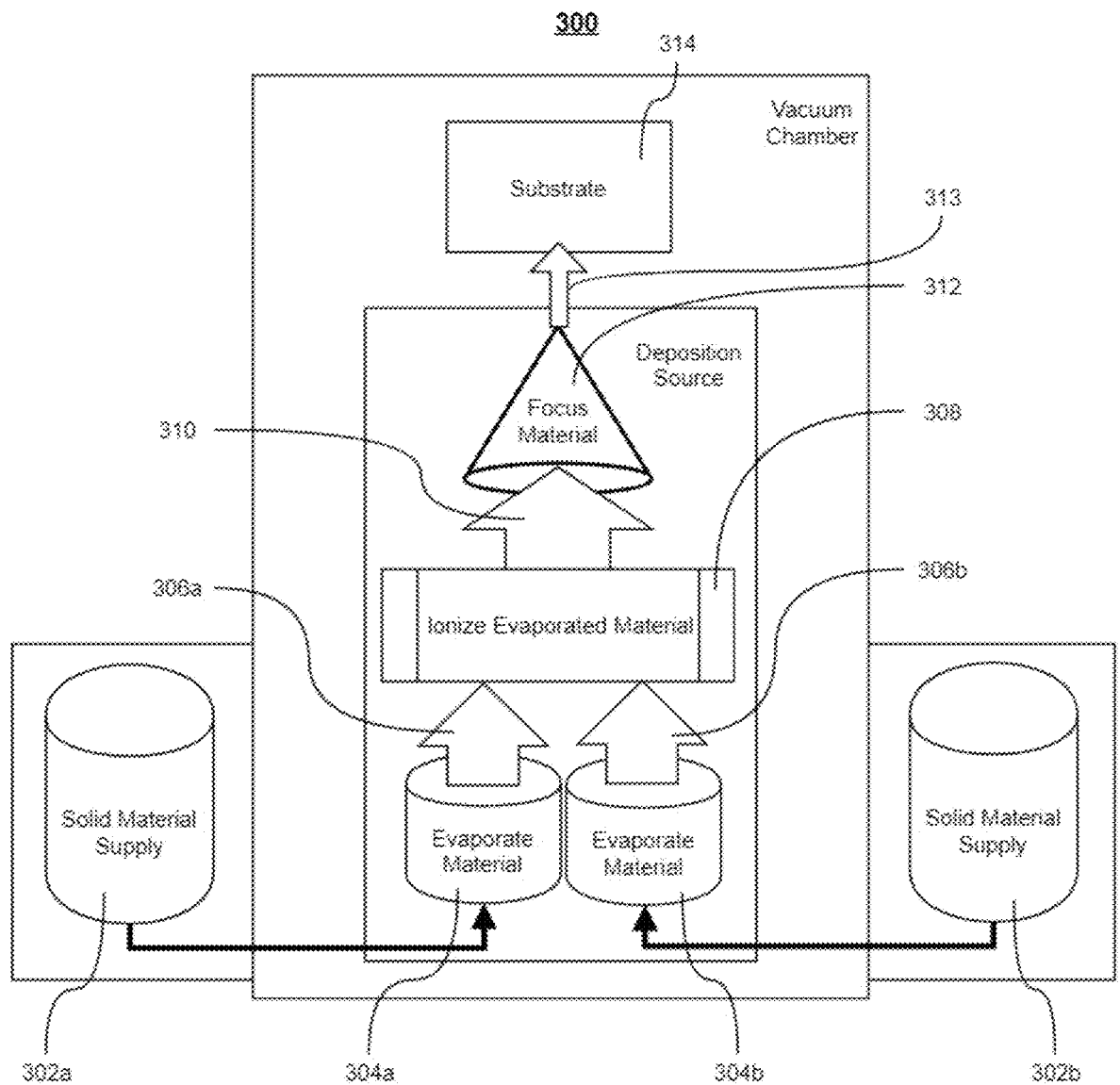
FIG. 3 is a diagram of an additive manufacturing process in accordance with the present disclosure with multiple deposition material feed sources.

FIG. 3 illustrates another exemplary embodiment in accordance with the present disclosure of an additive manufacturing process 300 similar to that of FIG. 1, but with multiple solid deposition material supply sources 302*a/b* feeding multiple evaporation sources 304*a/b*. Multiple evaporation sources 304*a/b* may be used when different deposition materials are used and/or required due different evaporation temperatures of the particular metals and ceramic deposition materials. The evaporation flux 306*a/b* from each evaporation source 304*a/b* are then ionized in the ionization source 308. The ionization source 308 can be a single ionization source that ionizes the evaporation flux 306*a/b* from each evaporation source 304*a/b* or be a separate ionization source (not shown) for each evaporation source 304*a/b*. When each evaporation source 304*a/b* has a dedicated ionization source, the evaporation sources 304*a/b* and ionization sources may be combined and run from a single power source. Combined power sources are illustrated in FIGS. 4 and 5.

Figure 4:
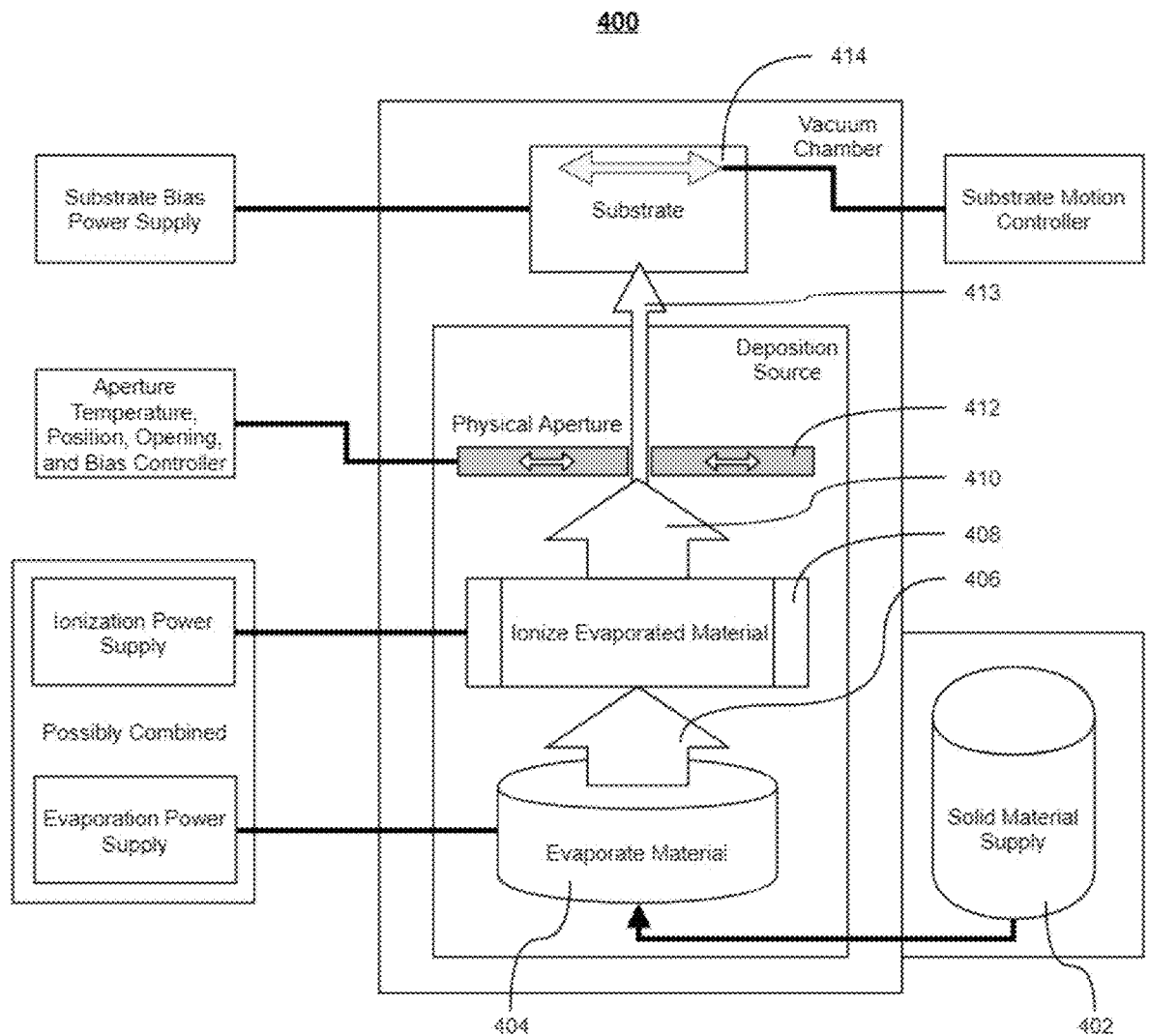
FIG. 4 is a diagram of an additive manufacturing process in accordance with the present disclosure showing an ionized evaporation flux traveling through a physical aperture.

FIG. 4 illustrates another exemplary embodiment in accordance with the present disclosure of an additive manufacturing process 400 that utilizes a physical aperture 412 to restrict the cross section of the ionization flux 410. The physical aperture 412 can be electrically biased and or heated to reduce the probability of condensation of the ionized evaporation flux 410 on the physical aperture 412. The additive manufacturing process 400 allows the ionized deposition flux 413 leaving the physical aperture 412 and arriving on the surface of the substrate 414 to move relative to the surface of the substrate 414. In accordance with various aspects of the present disclosure, to accomplish this movement, the physical aperture 412 may be configured top move relative to the substrate 414 or the substrate 414 can be configured to move relative to the physical aperture 412. In accordance with various aspects of the present disclosure, the physical aperture 412 can also be opened or closed, to enlarge or reduce the size of the aperture and thereby control the deposition rate and or cross-sectional ionized deposition flux spot size on the surface of the substrate 414.

Figure 5:
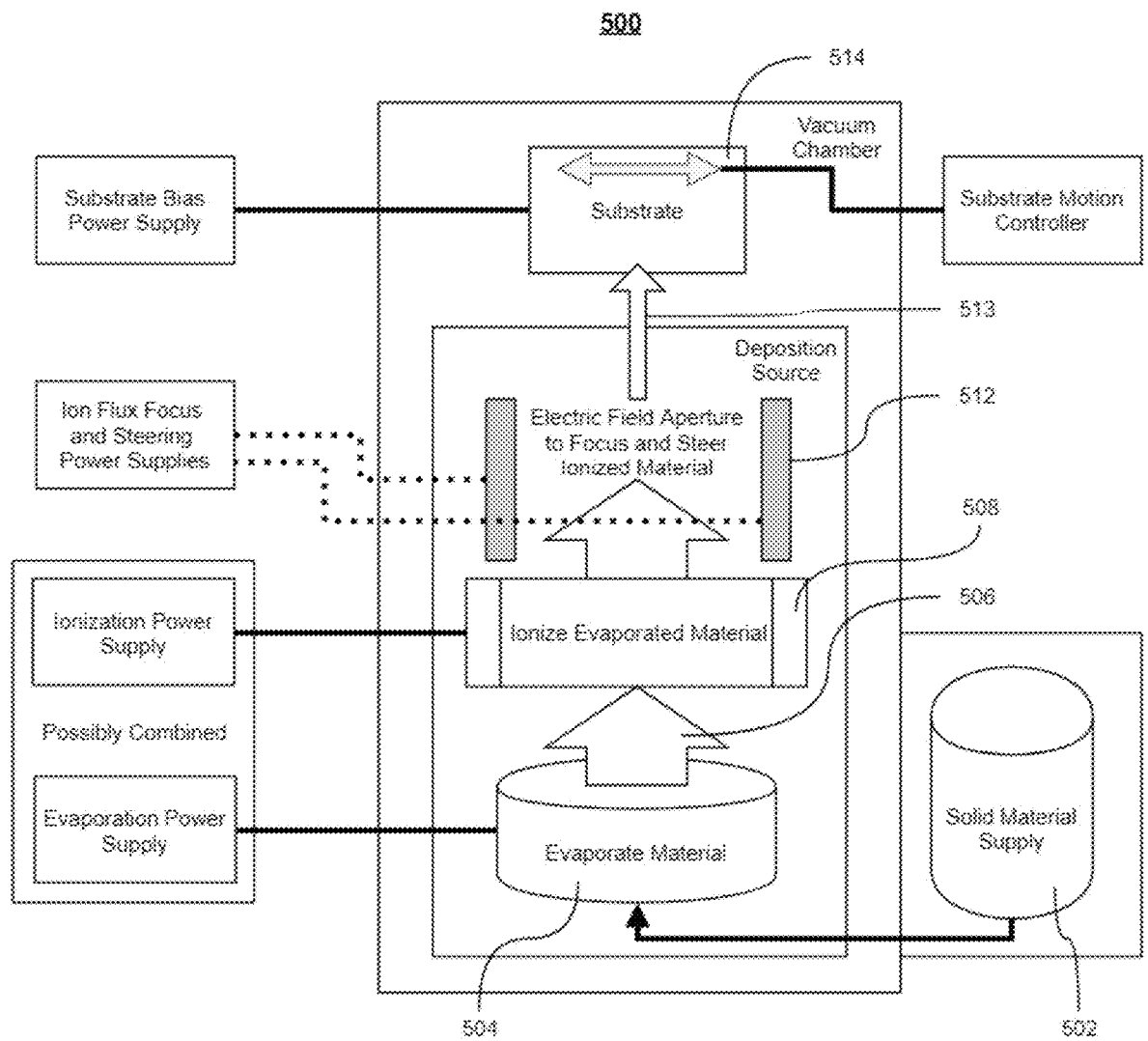
FIG. 5 is diagram of an additive manufacturing process in accordance with the present disclosure with an ionized evaporation flux traveling through an electric field aperture.

FIG. 5 illustrates another exemplary embodiment in accordance with the present disclosure of an additive manufacturing process 500 that utilizes an electrical or magnetic aperture 512 to consolidate and/or focus ionized deposition flux 510. An electrical aperture 512 can be used to control the size and relative position of the ionized deposition flux 510 deposition spot on the surface of the substrate 514. In accordance with some aspects of the present disclosure, controlling the ionized flux cross section and contact spot with electrical fields may be more efficient for process control than a magnetic control because the mass of the ions are much larger than electrons used in comparable electron beam control techniques.

Finally, it will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

Likewise, numerous characteristics and advantages have been set forth in the preceding description, including various alternatives together with details of the structure and function of the devices and/or methods. The disclosure is intended as illustrative only and as such is not intended to be exhaustive. It will be evident to those skilled in the art that various modifications may be made, especially in matters of structure, deposition materials, elements, components, shape, size and arrangement of parts including combinations within the principles of the invention, to the full extent indicated by the broad, general meaning of the terms in which the appended claims are expressed. To the extent that these various modifications do not depart from the spirit and scope of the appended claims, they are intended to be encompassed therein.

I claim:

1. An additive manufacturing process within a vacuum chamber, comprising the steps of:
    evaporating a deposition material using at least one of resistive heating, inductive heating, and thermal radiation to form an evaporated deposition material flux;
    ionizing the evaporated deposition material flux to form an ionized deposition material flux;
    focusing the ionized deposition material flux through an aperture mechanism; and
    accelerating the ionized deposition material flux toward a substrate located within the vacuum chamber using at least one electrode located between the substrate and the evaporated deposition material flux;
    providing an electric field for controlling an ionized deposition flux kinetic energy produced by electrodes located between the substrate and the aperture mechanism; and
    depositing the ionized deposition material flux onto a surface of the substrate.

2. The additive manufacturing process within a vacuum chamber of claim 1, wherein the ionizing step is performed with an ionization mechanism.

3. The additive manufacturing process within a vacuum chamber of claim 2, wherein the ionization mechanism is separate from an evaporating mechanism.

4. The additive manufacturing process within a vacuum chamber of claim 1, wherein an ionized deposition material flux surface contact area at the surface of the substrate is controlled by the aperture mechanism, and wherein the aperture mechanism is at least one of a physical, electrical, or magnetic aperture mechanism.

5. The additive manufacturing process within a vacuum chamber of claim 1, wherein the surface of the substrate can be any combination of positive, negative, and grounded electrical potentials to control kinetic energy of the ionized deposition material flux arriving at the surface of the substrate.

6. The additive manufacturing process within a vacuum chamber of claim 1, wherein an electrical potential of the substrate is at least one of constant, variable with time, and synchronized with at least one of an electrical variations and a deposition material flux variation.

* * * * *